(12) United States Patent
Sekiguchi et al.

(10) Patent No.: US 7,386,024 B2
(45) Date of Patent: Jun. 10, 2008

(54) QUANTUM CASCADE LASER DEVICE

(75) Inventors: Ryota Sekiguchi, Atsugi (JP); Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 210 days.

(21) Appl. No.: 11/180,534

(22) Filed: Jul. 14, 2005

(65) Prior Publication Data

US 2006/0039431 A1    Feb. 23, 2006

(30) Foreign Application Priority Data

Jul. 16, 2004   (JP) ............................ 2004-210113

(51) Int. Cl.
*H01S 5/00* (2006.01)

(52) U.S. Cl. ............................ 372/45.012; 372/45.01; 372/46.01; 372/50.1

(58) Field of Classification Search ............... None
See application file for complete search history.

(56) References Cited

U.S. PATENT DOCUMENTS

| | | | | |
|---|---|---|---|---|
| 5,023,879 A | * | 6/1991 | Wang et al. | 372/43.01 |
| 5,164,953 A | * | 11/1992 | Case et al. | 372/69 |
| 5,477,060 A | * | 12/1995 | Choi | 257/15 |
| 5,509,025 A | * | 4/1996 | Capasso et al. | 372/45.012 |
| 5,586,131 A | | 12/1996 | Ono et al. | 372/19 |
| 5,659,560 A | | 8/1997 | Ouchi et al. | 372/27 |
| 5,699,373 A | | 12/1997 | Uchida et al. | 372/27 |
| 5,764,670 A | | 6/1998 | Ouchi | 372/45.01 |
| 6,055,254 A | * | 4/2000 | Capasso et al. | 372/45.01 |
| 6,154,475 A | * | 11/2000 | Soref et al. | 372/45.011 |
| 6,854,901 B1 | | 2/2005 | Ouchi | 385/89 |
| 7,062,116 B2 | | 6/2006 | Ouchi | 385/14 |
| 2003/0219052 A1 | * | 11/2003 | Goodhue et al. | 372/45 |
| 2005/0041711 A1 | * | 2/2005 | Belenky et al. | 372/45 |
| 2006/0214176 A1 | | 9/2006 | Ouchi et al. | 257/98 |

OTHER PUBLICATIONS

Rudeger Kohler et al., "Terahertz semicondonductor-heterostructure laser", Nature, vol. 417, 2002, pp. 156-159.

(Continued)

*Primary Examiner*—Minsun Harvey
*Assistant Examiner*—Sean Hagan
(74) *Attorney, Agent, or Firm*—Fitzpatrick, Cella, Harper & Scinto

(57) ABSTRACT

A device includes a multiple quantum well with potential barriers and quantum wells, and an electric field element for applying an electric field thereto. The multiple quantum well includes at least two regions A and a region B disposed therebetween. The region A includes a plurality of energy levels, and a carrier is transported from a specific energy level i to a specific energy level f in the region A through one of the potential barriers by photon-assisted tunneling. The region B includes a plurality of energy levels, and an energy relaxation is performed with a relaxation time shorter than a transit time of the carrier in the region A from a specific energy level e to a specific energy level g in the region B. When an electric field is applied, electric current flows through the multiple quantum well and light is emitted or absorbed in the region A.

10 Claims, 2 Drawing Sheets

OTHER PUBLICATIONS

K.K. Choi et al., "Periodic negative conductance by sequential resonant tunneling through an expanding high-field superlattice domain", Physical Review B, vol. 35, 1987, pp. 4172-4175.

Rudeger Kohler et al., "Terahertz quantum-cascade lasers based on an niterlaced photon-phonon cascade", Applied Physics Letters, vol. 84, 2004, pp. 1266-1268.

* cited by examiner

QUANTUM CASCADE LASER DEVICE

BACKGROUND OF THE INVENTION

1. Field of the Invention

The present invention relates to a current injection-type optical semiconductor device and a semiconductor laser device in a frequency domain of a millimeter-wave band to a terahertz band (for example, from 30 GHz to 30 THz).

2. Description of the Related Art

A quantum cascade laser in which carrier transitions are performed between energy levels in the same energy band of either a conduction band or a valence band has been disclosed as a semiconductor laser. Since the oscillation wavelength of such a laser depends on the energy gap between two energy levels relating to optical transition, the oscillation wavelength can be selected over a wide spectrum range (for example, from a mid-infrared region to a terahertz band). In one example, laser light was achieved in a quantum cascade laser in which the oscillation wavelength was selected at 4.2 μm in the mid-infrared region. In another example, as disclosed by Rüdeger Köhler et al., (Nature, vol. 417 (2002), 156), a laser oscillation was confirmed even in a quantum cascade laser in which the oscillation wavelength was selected at 67 μm in the terahertz band. This suggests that such a semiconductor laser, in which carrier transitions are performed between energy levels in the same energy band of either a conduction band or a valence band, is useful as a light source in the terahertz band.

A description of a quantum cascade laser will now be provided with reference to FIG. 4.

FIG. 4 shows a part of the structure of a conduction band when an electric field is applied to a quantum cascade laser. A region A 410 includes potential barriers 441, 443, 445, and 447, and quantum wells 442, 444, and 446. This structure provides energy levels 411, 412, and 413 in the region A 410. A region B 420 includes potential barriers 447, 449, 451, 453, and 455, and quantum wells 448, 450, 452, and 454. This structure provides a mini-band 421 in which a plurality of energy levels is bundled. The region A 410 and the region B 420 are periodically repeated a plurality of times. A region A 430 indicates a region A in the subsequent period.

When a predetermined electric field is applied to the quantum cascade laser, an electric current flows. In particular, an electron undergoes an optical transition 401 from the energy level 411 to the energy level 412 in the region A 410, thereby emitting light having a wavelength corresponding to the energy gap between the energy level 411 and the energy level 412. Subsequently, the electron at the energy level 412 in the region A 410 is extracted to the region B 420 through the energy level 413 by, for example, optical phonon scattering 402. The electron passing through the mini-band 421 in the region B 420 is injected in the subsequent region A 430 and undergoes the optical transition as in the region A 410. Since the energy gap between the energy level 411 and the energy level 412 can be freely designed, light emitted by the quantum cascade laser can be selected over a wide spectrum range. Such light is resonated with an appropriate optical resonator, thereby performing laser oscillation.

In order that the oscillation wavelength is selected in the range from the millimeter-wave band to the terahertz band, the energy gap between two energy levels relating to the optical transition in the region A should be as small as the broadening of an energy level that is essentially inevitable (11 meV, K. K. Choi et al., Physical Review B, vol. 35 (1987), 4172) or less. Therefore, in the structure of the known quantum cascade laser in which the oscillation wavelength is selected in the range from the millimeter-wave band to the terahertz band, a non-radiative current path wherein carriers flow from the region A to the region B without undergoing the optical transition, or a non-radiative current path wherein carriers flow from the region B to the region A without undergoing the optical transition, forms a short-circuit. In a typical case, the carriers in the region B remain in a warmed up state. As a result, a population inversion required for laser oscillation typically cannot be achieved.

Accordingly, to perform laser oscillation in which the oscillation wavelength is selected at the terahertz band, the known quantum cascade laser must typically be cooled to a low temperature (95 K or less, Rüdeger Köhler et al., Applied Physics Letters, vol. 84 (2004), 1266). Therefore, a semiconductor laser device that performs laser oscillation at higher temperatures (for example, room temperature of 300K) is desired.

SUMMARY OF THE INVENTION

Accordingly, the present invention provides a device including a multiple quantum well including potential barriers and quantum wells, and an electric field element for applying an electric field to the multiple quantum well. In the device, the multiple quantum well includes at least two regions A and a region B disposed therebetween. The region A includes a plurality of energy levels, and a carrier is transported from a specific energy level i to a specific energy level f in the region A through one of the potential barriers by photon-assisted tunneling. The region B includes a plurality of energy levels, and an energy relaxation is performed with a relaxation time shorter than a transit time of the carrier in the region A from a specific energy level e to a specific energy level g in the region B. In the device, when a predetermined electric field is applied to the multiple quantum well via the electric field element, an electric current flows through the multiple quantum well and light is emitted or absorbed in the region A.

Since a tunneling that is allowed by an interaction with light (i.e., photon-assisted tunneling) is used as an optical transition, the binding of two energy levels relating to the optical transition in the region A and the region B becomes selective. According to this structure, a non-radiative current can be reduced, and in addition, the transit time of carriers in the region A can be limited by the potential barrier. As a result, the energy distribution of carriers in the region B can be stabilized as follows. When the relaxation time of carriers in the region B is shorter than the transit time of carriers in the region A, the energy distribution of unstable carriers in the region B, or the carriers remaining in a warmed up state, is cooled so as to approach a quasi-Fermi distribution. With reference to the energy relaxation, the energy relaxation time of carriers in the region B becomes shorter than the transit time of carriers in the region A including the photon-assisted tunneling by utilizing a high-speed relaxation mechanism. As a result, the energy distribution of carriers in the region B can be stabilized. Accordingly, this structure can more reliably provide the population inversion between two energy levels relating to a radiative transition in the region A that is combined with the region B.

In order to achieve this, the energy gap between two energy levels in the region B that is combined with the region A can be selected so as to be resonant with optical phonon energy. In such a case, the energy relaxation of carriers caused by optical phonon scattering can be selected as the relaxation mechanism. Such an optical phonon scattering, which is known as a high-speed phenomenon, is suitable for stabilizing the energy distribution of carriers in the region B.

The energy gap between two energy levels in the region B that is combined with the region A is controlled so as to be larger than a distribution width that becomes unstable by thermal energy. In such a case, when the energy distribution of carriers in the region B is stabilized, a difference in the occupation ratio of carriers can be provided at each energy level, even at higher temperatures. In other words, each occupation ratio of carriers is immediately reflected on the occupation ratio of carriers at two energy levels relating to the radiative transition in the region A with which each of the energy levels in the region B is combined. Therefore, the population inversion between the two energy levels relating to the radiative transition in the region A can be more reliably maintained even at higher temperatures. That is, laser oscillation can be achieved at higher temperatures.

However, when carriers are disposed in the region B, free carrier absorption of light of the terahertz band is typically large and typically not negligible. Therefore, it is also important to minimize the freedom of movement of carriers in the region B. Accordingly, two energy levels in the region B can be selected from a number of combinations obtained from, for example, the ground level, the first excited level, the second excited level, and the third excited level in the region B.

Further features and advantages of the present invention will become apparent from the following description of exemplary embodiments with reference to the attached drawings.

DESCRIPTION OF THE EMBODIMENTS

An exemplary embodiment of the present invention will now be described with reference to FIG. 1.

In a multiple quantum well in a semiconductor device according to the present invention, a region A 110 and a region B 120 are periodically repeated as a repeating unit. FIG. 1 shows a part of the structure of a conduction band when an electric field is applied to the multiple quantum well.

The region A 110 includes potential barriers 141, 143, and 145, and quantum wells 142 and 144. This structure provides an energy level i (111) and an energy level f (112). The energy level i and the energy level f are spatially separated by the potential barrier 143. However, when the energy levels are designed so that a weak-coupling (i.e. overlap of wave functions is relatively small) is formed, an electron is transported from the energy level i to the energy level f by photon-assisted tunneling 101.

Figure 1:
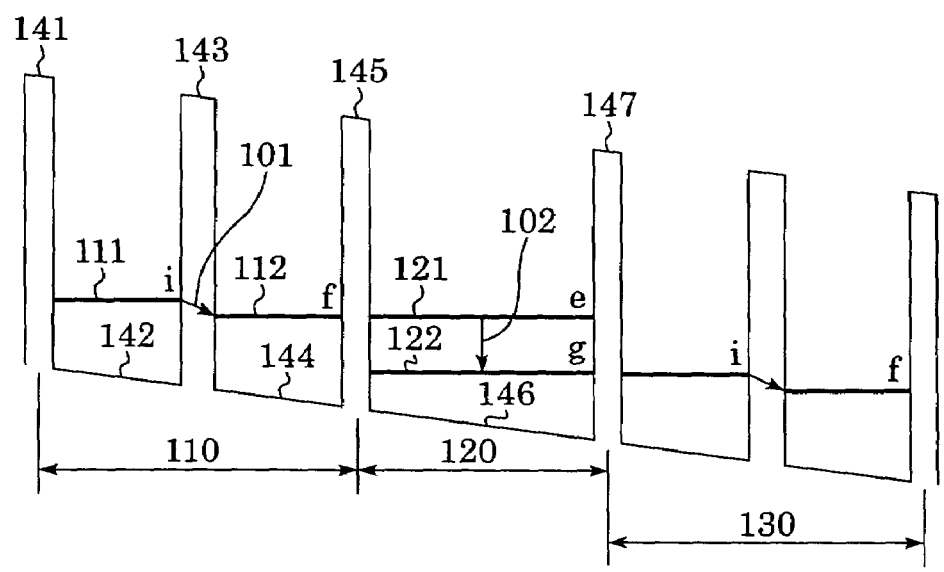
FIG. 1 shows a part of the structure of a conduction band when an electric field is applied to a multiple quantum well according to an exemplary embodiment of a semiconductor device of the present invention.

As shown in FIG. 1, when energy $E_i$ of the energy level i is larger than energy $E_f$ of the energy level f and an electron is transported from the energy level i to the energy level f, light having an energy of $$\hbar\omega$$

satisfying $$|E_f - E_i| = \hbar\omega \qquad \text{Formula [1]}$$

is emitted, wherein $$\hbar$$

represents the Planck constant and $\omega$ represents a frequency of light. Since the energy $E_i$ and the energy $E_f$ depend on the structure of the multiple quantum well in the region A 110 and the electric field strength, the relationship between the energy $E_i$ and the energy $E_f$ can be provided. In other words, the wavelength of light corresponding to the energy gap between the energy level i and the energy level f can be selected according to the structure of the multiple quantum well in the region A 110 and the electric field strength.

Although not shown in FIG. 1, when the energy $E_i$ is smaller than the energy $E_f$ and an electron is transported from the energy level i to the energy level f, light having an energy of $$\hbar\omega$$

is absorbed. It is estimated that the electron transportation from the energy level i to the energy level f, or the electron transportation including the photon-assisted tunneling 101, requires at least ten picoseconds.

The region B 120 includes potential barriers 145 and 147 and a quantum well 146. This structure provides an energy level e (121) and an energy level g (122). In the case shown in FIG. 1, the energy level e is selected from the first excited level that is a first excited state in the region B 120, and the energy level g is selected from the ground level that is a ground state in the region B 120. When energy $E_e$ of the energy level e and energy $E_g$ of the energy level g are designed so as to satisfy a formula $$E_e - E_g \approx \hbar\omega_{LO} \qquad \text{[Formula 2]},$$

an electron undergoes an energy relaxation from the energy level e to the energy level g by optical phonon scattering 102, with an energy of $$\hbar\omega_{LO},$$

wherein $$\hbar$$

represents the Planck constant and $\omega_{LO}$ represents a frequency of an optical phonon within about several hundreds of femtoseconds to one picosecond.

When a strong-coupling (i.e. overlap of wave functions is relatively large) is formed between the energy level f in the region A 110 and the energy level e in the region B 120 with the potential barrier 145 therebetween, and is formed between the energy level g in the region B 120 and the energy level i in a region A 130 in the subsequent period with the potential barrier 147 therebetween, electrons are transported as follows: At the energy level f in the region A 110, electrons are extracted until the occupation ratio of electrons becomes equal to the occupation ratio of electrons at the energy level e in the region B 120. At the energy level i in the region A 130, electrons are injected until the occupation ratio of electrons becomes equal to the occupation ratio of electrons at the energy level g in the region B 120. These electron transportations do not typically require a long time.

Accordingly, the occupation ratios of electrons at the energy level e and the energy level g in the region B 120 follow a quasi-Fermi distribution. Herein, in view of a distribution width $k_B T$ that becomes unstable by thermal energy and in order to achieve a significant difference in occupation ratios (i.e., in order to achieve a population inversion between the energy level i and the energy level f, and in a broader sense, in order to easily cause the photon-assisted tunneling from the energy level i to the energy level f), a formula $$E_e - E_g > k_B T \quad \text{[Formula 3]}$$

can be satisfied (wherein $k_B$ represents the Boltzmann constant and T represents a temperature). For example, when the energy gap is designed so as to exceed 26 meV, which is a thermal energy at room temperature (300K), the following operation can be performed even at room temperature.

When a predetermined electric field is applied to the multiple quantum well of a semiconductor device according to the present invention, an electric current flows through the multiple quantum well. In particular, an electron at the energy level i in the region A 110 is transported to the energy level f by the photon-assisted tunneling 101. The electron at the energy level f is extracted to the energy level e in the region B 120. The electron at the energy level e in the region B 120 undergoes an energy relaxation to the energy level g by the optical phonon scattering 102. The electron at the energy level g in the region B 120 is injected to an energy level i in the region A 130 in the subsequent period. The electron at the energy level i is transported to an energy level f by the photon-assisted tunneling 101 as in the region A 110. In other words, when an electron is injected in one end of the multiple quantum well, the electron is extracted from the other end. Herein, the multiple quantum well operates as an optical semiconductor device that emits light as a whole. Although not shown in FIG. 1, the multiple quantum well can be selected so as to operate as an optical semiconductor device that absorbs light as a whole. Furthermore, when an optical resonator structure that resonates with light having an energy of $$\hbar\omega$$

to be emitted is installed so as to include the multiple quantum well, the optical semiconductor device described above can operate as a semiconductor laser device.

A detailed operation of the thickness in each semiconductor forming the multiple quantum well can be obtained by calculating the Schrödinger equation or calculating the Schrodinger equation and the Poisson equation with a self-consistent manner.

Figure 2:
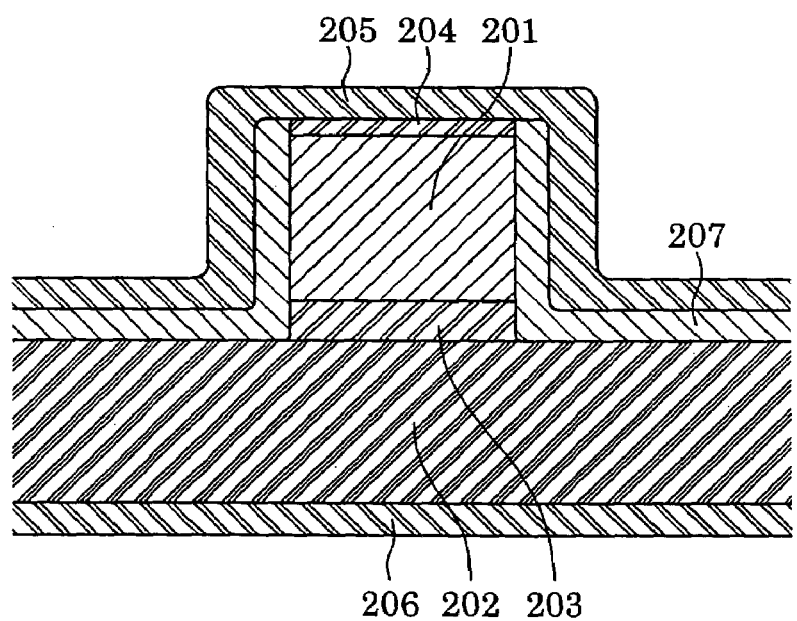
FIG. 2 shows a cross-sectional structure of a semiconductor device according to an exemplary embodiment of the present invention.

FIG. 2 shows a cross-sectional structure of a semiconductor device according to an exemplary embodiment of the present invention. In this exemplary embodiment, a multiple quantum well 201 is composed of semiconductor materials of GaInAs/InAlAs, wherein the lattice is matched with an n-InP substrate 202. The semiconductor device includes the multiple quantum well 201, heavily doped n⁺-GaInAs layers 203 and 204 laminated on both sides of the multiple quantum well 201, an ohmic electrode 205 disposed on the n⁺-GaInAs layer 204, and an ohmic electrode 206 disposed under the n-InP substrate 202. The n⁺-GaInAs layers 203 and 204 and the upper ohmic electrode 205 in such a structure can function as a surface plasmon waveguide that can propagate light to a space narrower than its wavelength.

The device of this exemplary embodiment can be produced as follows. First, the n⁺-GaInAs layer 203, the multiple quantum well 201, and the n⁺-GaInAs layer 204 are formed on the n-InP substrate 202 in order by, for example, a molecular beam epitaxial deposition. A stripe is then formed by, for example, etching and an insulator 207 is formed so as to cover the side faces of the stripe. Subsequently, for example, Cr/Au layers are formed on the n⁺-GaInAs layer 204 by vapor deposition to form the ohmic electrode 205. In addition, AuGe/Ni/Au layers are formed, for example, under the n-InP substrate 202 by vapor deposition to form the ohmic electrode 206. Facets are formed by cleavage and function as a reflecting mirror.

When contacts are provided to the ohmic electrodes 205 and 206 in such a structure by, for example, wire bonding or die bonding, and a predetermined electric field is applied between the ohmic electrodes 205 and 206, light having a wavelength determined by the multiple quantum well 201 is emitted in the stripe. Furthermore, when the emitted light is propagated in the surface plasmon waveguide along the stripe and is resonated with a Fabry-Perot resonator disposed between the facets, laser oscillation can be performed.

In addition, an antireflection coating that suppresses the reflectance of the facets and decreases the resonance may be coated on the facets. In such a case, light entering from one facet is amplified and output to the other facet. Thus, the device can operate as an optical amplifier.

Table 1 shows an example of a detailed structure of a repeating unit in the multiple quantum well 201 in FIG. 2. The device can be based on an optical phonon energy in the GaInAs used in the region B of about 32 meV. According to this design, when an electric field is applied such that the electric field strength in the multiple quantum well 201 is 5.0 kV/cm, it is estimated that light having a wavelength of about 0.12 mm is emitted.

TABLE 1

| | Semiconductor material | Doping concentration | Thickness | Correspondence with FIG. 1 |
|---|---|---|---|---|
| Repeating unit including region A and region B | InAlAs | Undoped | 4.0 nm | 141: Potential barrier |
| | GaInAs | Undoped | 17 nm | 142: Quantum well |
| | InAlAs | Undoped | 5.0 nm | 143: Potential barrier |
| | GaInAs | Undoped | 17 nm | 144: Quantum well |
| | InAlAs | Undoped | 4.0 nm | 145: Potential barrier |
| | n-GaInAs | $2 \times 10^{17}$ cm$^{-3}$ | 28 nm | 146: Quantum well |

Figure 3:
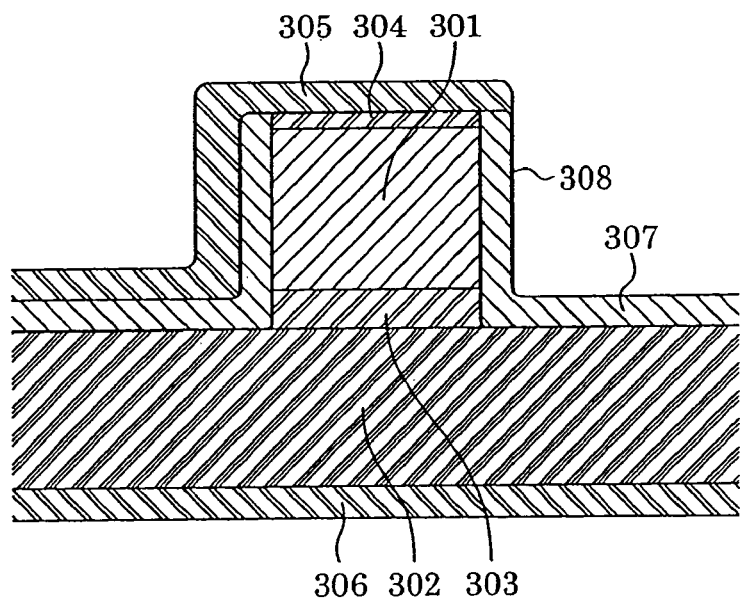
FIG. 3 shows a cross-sectional structure of a semiconductor device according to another exemplary embodiment of the present invention.
Figure 4:
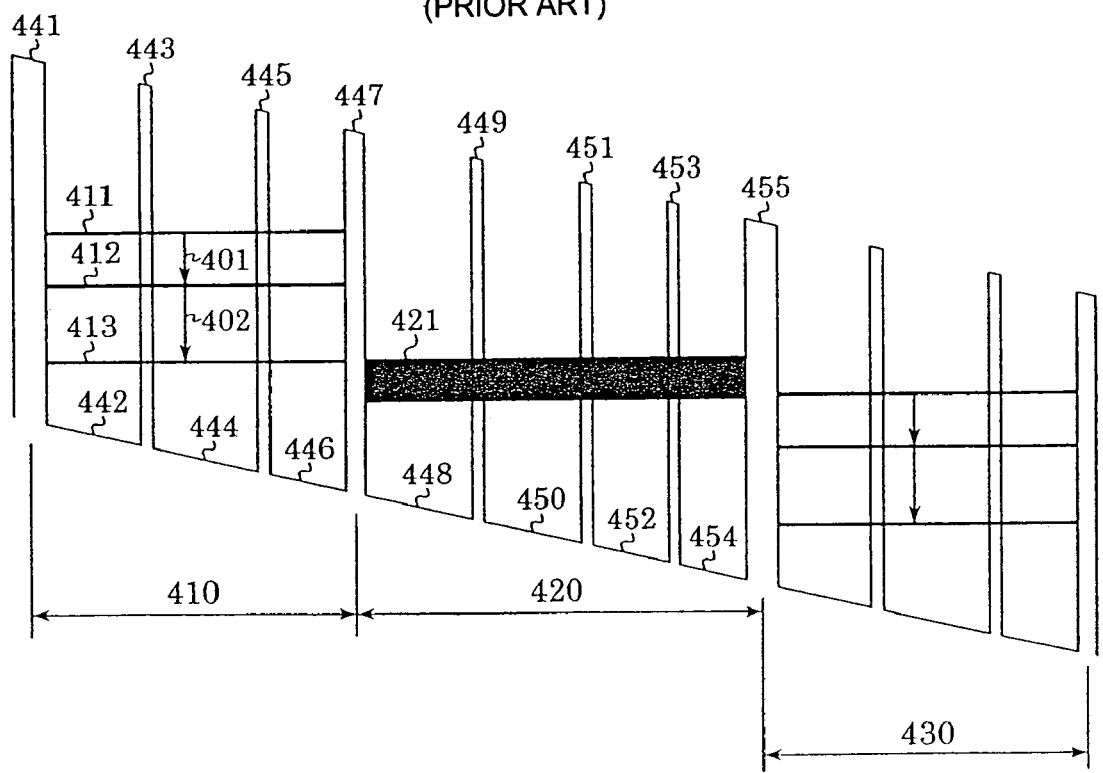
FIG. 4 shows a part of the structure of a conduction band when an electric field is applied to a known quantum cascade laser.

FIG. 3 shows a cross-sectional structure of a semiconductor device according to another exemplary embodiment of the present invention. The semiconductor device of this exemplary embodiment is a modification of the previous exemplary embodiment, and has almost the same structure of the semiconductor device shown in the previous exemplary embodiment. However, in this exemplary embodiment, a multiple quantum well 301 is designed so as to have a structure that absorbs light. As such, an ohmic electrode 305 of the semiconductor device has a different shape in order to form a window 308.

When a predetermined electric field is applied between the ohmic electrodes 305 and 306 in such a structure, light having a wavelength determined by the multiple quantum well 301 is absorbed in the stripe. In particular, when light enters from the window 308, an electric current flows through the multiple quantum well 301 to generate a signal for optical detection.

In the above exemplary embodiments, GaInAs/InAlAs wherein the lattice is matched with the InP substrate is used as the semiconductor material. Alternatively, other semiconductor materials, such as GaAs/AlGaAs disposed on a GaAs substrate or GaN/InAlN disposed on a GaN substrate, may be used. In view of the operation at room temperature, the optical phonon energy of the semiconductor material used in the region B exceeds 26 meV, which is a thermal energy at room temperature. In addition, the optical resonator structure for laser oscillation is not limited to the above exemplary embodiments. Other optical resonator structures, such as a cavity resonator, a distributed feedback (DFB) resonator, a photonic crystal resonator, and a photonic fractal structure, may also be used.

As described above, in the known quantum cascade laser in which the oscillation wavelength is selected in the terahertz band, the decrease in the non-radiative current that forms a short-circuit between the region A and the region B, and the stabilization of energy distribution of carriers in the region B have been desired. The device of the present invention can decrease the non-radiative current and improve stability for the energy distribution of carriers in the region B. Thus, according to the advantage of the present invention, laser oscillation can be performed at higher temperatures, for example, at room temperature of 300K.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-210113 filed Jul. 16, 2004, the contents of which are hereby incorporated by reference herein.

What is claimed is:

1. A device comprising:
    a multiple quantum well including potential barriers and quantum wells; and
    an electric field element for applying an electric field to the multiple quantum well,
    the multiple quantum well includes at least two regions A and a region B disposed therebetween,
    the region A includes a plurality of energy levels, and a plurality of carriers are transported from a specific energy level i to a specific energy level f in the region A through one of the potential barriers by photon-assisted tunneling,
    each of the carriers is transported between the specific energy level f and a specific energy level e in region B through the potential barriers,
    the region B includes a plurality of energy levels, and an energy relaxation is performed with a relaxation time shorter than a transit time of the carriers in the region A from the specific energy level e to a specific energy level g in the region B,
    and when a predetermined electric field is applied to the multiple quantum well via the electric field element, an electric current flows through the multiple quantum well and light is emitted or absorbed in the region A.

2. The device according to claim 1, wherein the multiple quantum well comprises a semiconductor and the plurality of energy levels in the region A and the region B belong to a conduction band or a valence band.

3. The device according to claim 2, wherein an energy gap between the energy level g and the energy level e in the region B is resonant with optical phonon energy, an optical phonon scattering is used to perform the energy relaxation.

4. The device according to claim 1, wherein an energy gap between the energy level g and the energy level e in the region B is larger than a thermal energy.

5. The device according to claim 1, wherein an energy level g and the energy level e in the region B are selected from a ground level, a first excited level, a second excited level, and a third excited level in the region B.

6. The device according to claim 1, wherein energy of the energy level i in the region A is selected so as to be larger than energy of the energy level f, light is emitted.

7. The device according to claim 1, wherein energy of the energy level i in the region A is selected so as to be smaller than energy of the energy level f, light is detected.

8. The device according to claim 1, further comprising: an optical resonator structure that resonates with light to be emitted in the region A, wherein the device performs laser oscillation.

9. The device according to claim 1, wherein the region A and the region B are periodically repeated as a repeating unit.

10. An apparatus comprising:
    a device according to claim 1; and
    a carrier-injecting element that injects a carrier to the device,
    wherein when the carrier is injected to the device, light is absorbed or emitted.

* * * * *

UNITED STATES PATENT AND TRADEMARK OFFICE
CERTIFICATE OF CORRECTION

| | | |
|---|---|---|
| PATENT NO. | : 7,386,024 B2 | Page 1 of 1 |
| APPLICATION NO. | : 11/180534 | |
| DATED | : June 10, 2008 | |
| INVENTOR(S) | : Sekiguchi et al. | |

It is certified that error appears in the above-identified patent and that said Letters Patent is hereby corrected as shown below:

TITLE PAGE, ITEM
    (56) References Cited, Other Publications, "an niterlaced photon-phonon" should read -- an interlaced photon-phonon --.

COLUMN 7:
    Line 51, "the" should read -- wherein the --.

COLUMN 8:
    Line 6, "through the" should read -- through another of the --;
    Line 22, "energy, an" should read -- energy, and an --;
    Line 28, "an" should read -- the --;
    Line 34, "level f, light" should read -- level f, and light --;
    Line 37, "level f, light" should read -- level f, and light --; and
    Line 38, "comprising:" should read -- comprising --.

Signed and Sealed this

Sixteenth Day of December, 2008

JON W. DUDAS
*Director of the United States Patent and Trademark Office*